(12) United States Patent
Esders et al.

(10) Patent No.: US 11,452,236 B2
(45) Date of Patent: Sep. 20, 2022

(54) HOUSING FOR AN ELECTRIC OR ELECTRONIC DEVICE

(71) Applicant: KOSTAL Automobile Eletrik GmbH & Co. KG, Luedenscheid (DE)

(72) Inventors: Berthold Esders, Schalksmuehle (DE); Matthias Thiel, Luedenscheid (DE); Thorsten Puehl, Nachrodt-Wiblingwerde (DE); Rene Riedel, Hattingen (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 561 days.

(21) Appl. No.: 16/563,355

(22) Filed: Sep. 6, 2019

(65) Prior Publication Data

US 2019/0394901 A1    Dec. 26, 2019

Related U.S. Application Data

(63) Continuation of application No. PCT/EP2018/060164, filed on Apr. 20, 2018.

(30) Foreign Application Priority Data

Apr. 20, 2017    (DE) .................... 10 2017 003 854.6

(51) Int. Cl.
*H05K 7/20*    (2006.01)
*H05K 9/00*    (2006.01)
(Continued)

(52) U.S. Cl.
CPC ....... *H05K 7/20272* (2013.01); *H05K 9/0047* (2013.01); *H05K 5/0008* (2013.01); *H05K 5/03* (2013.01)

(58) Field of Classification Search
CPC ............ H05K 7/20927; H05K 5/0247; H05K 7/20436; H05K 9/0037; H05K 7/1427
(Continued)

(56) References Cited

U.S. PATENT DOCUMENTS 3,523,215 A * 8/1970 Steinmetz, Jr. .... H05K 7/20927
361/689
4,078,604 A * 3/1978 Christl ...................... F02K 9/64
60/260
(Continued)

FOREIGN PATENT DOCUMENTS

DE        3601140 A *  7/1987  ........... H01L 23/473
DE   102005001148 B3    5/2006
(Continued)

OTHER PUBLICATIONS

The International Bureau of WIPO, International Preliminary Report on Patentability for International Application No. PCT/EP2018/060164 dated Oct. 31, 2019.
(Continued)

*Primary Examiner* — Krystal Robinson
(74) *Attorney, Agent, or Firm* — Brooks Kushman P.C.

(57) ABSTRACT

A housing includes a cup-shaped, plastic housing case; a cooling channel guided in the housing case for fluid cooling of an electric or electronic device situated in an interior of the housing case; and a planar shielding body integrated into the housing case and traversing walls of the housing case for shielding from electromagnetic radiation. The shielding body is a metallic wire cage or trough. The cooling channel is a metallic tubing. The shielding body and the cooling channel are connected to form a frame-like, pre-assembled assembly. The pre-assembled assembly, consisting of the
(Continued)

shielding body and the cooling channel, is extrusion-coated with a plastic or encapsulated in a plastic to form the housing case.

11 Claims, 1 Drawing Sheet

(51) Int. Cl.
*H05K 5/00* (2006.01)
*H05K 5/03* (2006.01)

(58) Field of Classification Search
USPC .................. 165/169, 104.33, 168; 174/17
See application file for complete search history.

(56) References Cited

U.S. PATENT DOCUMENTS

| | | | | |
|---|---|---|---|---|
| 4,327,399 A * | 4/1982 | Sasaki | ............... | F28D 15/0233 361/689 |
| 5,045,971 A * | 9/1991 | Ono | ............... | H04B 1/034 361/708 |
| 5,508,884 A * | 4/1996 | Brunet | ............... | H01L 23/427 361/698 |
| 6,031,751 A * | 2/2000 | Janko | ............... | F28F 13/00 165/80.4 |
| 6,236,207 B1 * | 5/2001 | Arz | ............... | G01R 33/3856 324/318 |
| 9,881,880 B2 * | 1/2018 | Busby | ............... | H01L 23/573 |
| 2002/0180108 A1 | 12/2002 | Koshiba | | |
| 2005/0180104 A1 * | 8/2005 | Olesen | ............... | H01L 23/473 361/689 |
| 2005/0253465 A1 * | 11/2005 | Takenaka | ............... | H02K 5/203 310/52 |
| 2006/0152912 A1 * | 7/2006 | Karrer | ............... | B60R 16/0239 361/790 |
| 2006/0207780 A1 * | 9/2006 | Shinmura | ............... | H05K 7/20927 174/50 |
| 2006/0227504 A1 * | 10/2006 | Chen | ............... | H05K 7/20909 361/679.52 |
| 2006/0232942 A1 * | 10/2006 | Nakatsu | ............... | H05K 7/1432 361/710 |
| 2009/0130530 A1 | 5/2009 | Tanaka | | |
| 2010/0163210 A1 * | 7/2010 | Kluge | ............... | F25D 27/00 174/547 |
| 2011/0100585 A1 * | 5/2011 | Hohenstein | ............... | H01L 23/473 165/41 |
| 2011/0261531 A1 * | 10/2011 | Hirashima | ............... | H05K 7/20927 361/689 |
| 2018/0160574 A1 | 6/2018 | Michalski et al. | | |

FOREIGN PATENT DOCUMENTS

| | | |
|---|---|---|
| DE | 112006002637 T5 | 8/2008 |
| DE | 202014105179 U1 | 11/2014 |
| DE | 102015205591 A1 | 9/2016 |
| DE | 102015107306 A1 | 11/2016 |
| EP | 2625938 A1 | 8/2013 |

OTHER PUBLICATIONS

European Patent Office, International Search Report for the corresponding International Application No. PCT/EP2018/060164, dated Jul. 23, 2018.

* cited by examiner

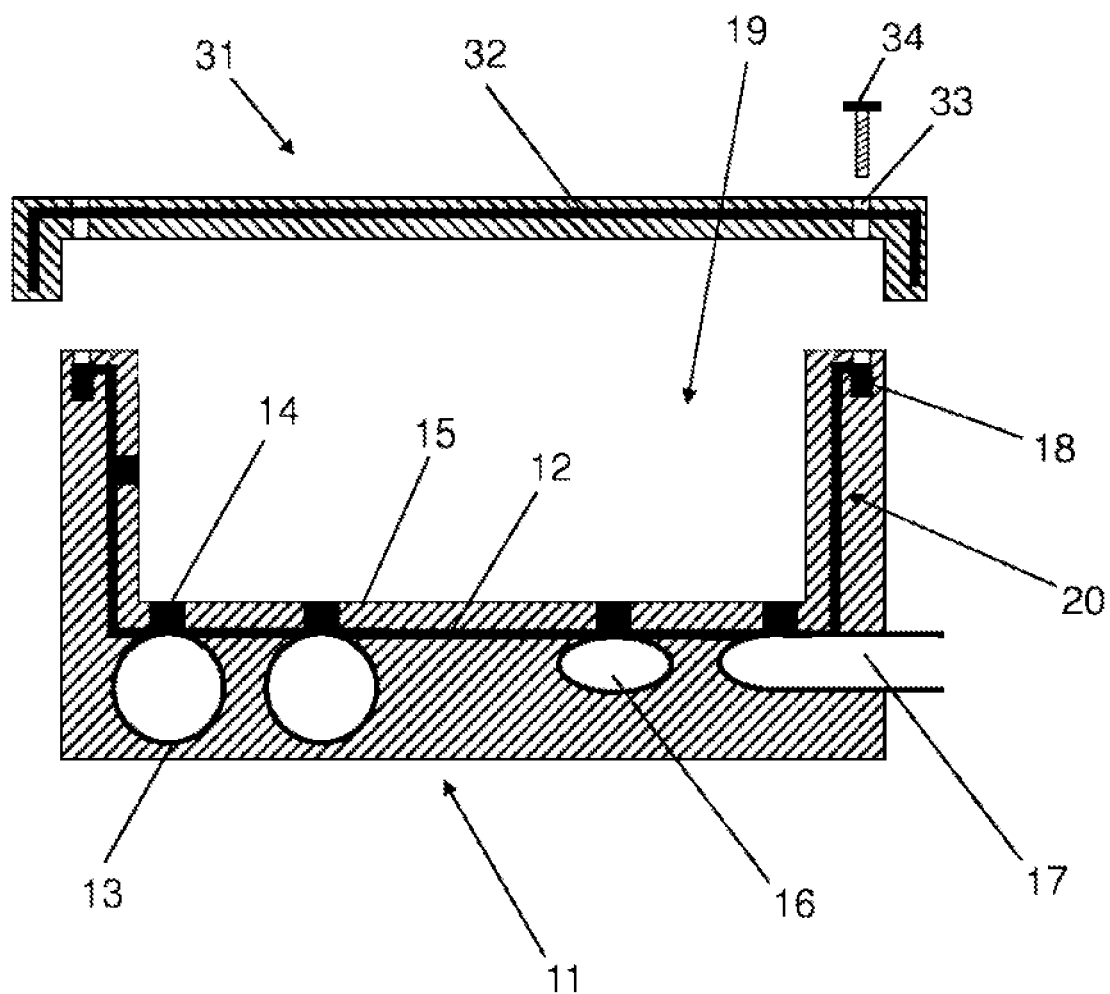

HOUSING FOR AN ELECTRIC OR ELECTRONIC DEVICE

CROSS-REFERENCE TO RELATED APPLICATIONS

This application is a continuation of International Application No. PCT/EP2018/060164, published in German, with an International filing date of Apr. 20, 2018, which claims priority to DE 10 2017 003 854.6, filed Apr. 20, 2017; the disclosures of which are hereby incorporated in their entirety by reference herein.

TECHNICAL FIELD

The present invention relates to a housing for an electric or electronic device, the housing having a cup-shaped, plastic housing case, at least one cooling channel guided in the housing case for fluid cooling of the device, and a planar shielding body integrated into the housing case and traversing the walls of the housing case for shielding from electromagnetic radiation.

BACKGROUND

Such housings are provided in particular for electric or electronic devices that handle high internal levels of electrical power, such as charging devices or power converters for electrically driven vehicles. The unavoidably occurring significant power losses from such devices require good heat dissipation or even active cooling.

It is common to manufacture housings made of a metal having good thermal conductivity, such as die-cast aluminum, in which the housing body may be used as a cooling element (i.e., a heat sink) and the housing surface as a heat radiating surface. Such housings have the advantage of allowing good electromagnetic shielding, both externally and internally. Unfortunately, the manufacture of such housings is relatively expensive due to high material costs and complex machining.

For this reason, plastic housings are often preferred, even though they require active cooling measures. It is known to provide plastic housings with piping, molded onto or into same, through which a cooling liquid can be conducted. In addition, for electromagnetic shielding, measures may be provided such as metallic shielding surfaces introduced into the plastic housing. Such metallic shielding surfaces may be implemented by metal foils, metal sheets, or metal fabric mats.

DE 10 2015 205 591 A1 describes a liquid-cooled housing case for an electric machine. The cup-shaped housing case is made of a plastic. A cooling channel for fluid cooling of the electric machine is formed within the housing case. The cooling channel is molded onto the outer periphery of the housing case. A fabric layer that traverses the housing case is integrated into the housing case between an inner surface of the housing case and the cooling channel. The fabric layer may be made of a metal fabric, thus shielding from electromagnetic radiation.

Due to the provided measures for cooling and electromagnetic shielding, the plastic housing proposed therein has a complex shape which may entail relatively high manufacturing costs.

SUMMARY

An object is to design such a housing for an electric or electronic device that has a housing body made of a plastic, in such a way that it may be manufactured in a particularly simple and cost-effective manner.

In embodiments of the present invention, a housing for an electric or electronic device is provided. The housing includes a cup-shaped, plastic housing case (i.e., shell), a cooling channel that is guided in the housing case for fluidically cooling of the electric or electronic device, and a planar shielding body that traverses the walls (i.e., passes through the walls) of the housing case and is integrated into the housing case for shielding electromagnetic radiation. The electric or electronic device is to be situated in an interior of the housing case to be housed by the housing case. The shielding body is a metallic wire cage or a metal trough. The cooling channel is formed by a metal tube. The shielding body and the cooling channel are connected to form a pre-assembled assembly. The pre-assembled assembly, consisting of the shielding body and the cooling channel, is extrusion-coated (i.e., over molded) with a plastic or encapsulated in (i.e., molded into) a plastic to form the housing case.

The object is achieved according to embodiments of the present invention in that the shielding body is designed as a wire cage or a metal trough, the cooling channel is formed by a metal tube, the shielding body and the cooling channel are connected to form a pre-assembled assembly, and the pre-assembled assembly, made up of the shielding body and the cooling channel, is extrusion-coated with a plastic or encapsulated in a plastic to form the housing case.

The design of the housing according to embodiments of the present invention thus provides that metallic components for cooling and for electromagnetic shielding of the electric or electronic device are pre-assembled to form a frame-like assembly and subsequently enclosed with a housing case made of plastic, preferably in a single process step. In particular, it is proposed to extrusion-coat or wind a curing plastic around the pre-assembled assembly.

It is particularly advantageous that manufacturing the housing case made of plastic requires no complex machining steps, as would be necessary, for example, for molding wound cooling channels into a housing case.

It is also very advantageous that the shielding body as well as the cooling channel are made of metal, and after pre-assembly, form a single metal body having a relatively high heat capacity.

It is also advantageous that the shape of the cooling channel may be adapted in a very flexible manner by simply bending a metal tube.

It is advantageous to provide a low-viscosity plastic compound for winding around the pre-assembled assembly. Such a process may be carried out at low pressures, so that it is also possible to use thin-walled materials to form the pre-assembled assembly.

To improve the heat dissipation, a low-viscosity compound having good thermal conductivity may be provided as winding material, or a material having good thermal conductivity may be provided as filler of a curing plastic.

The shielding body may be formed by a more or less thin metal sheet or also by a metal foil, which may be brought into the intended shape quite easily. Alternatively, the use of a deep-drawn hollow metal body or stamped-bent sheet metal may be provided.

The assembly made up of the cooling channel and the shielding body may be pre-assembled very easily by means of nondetachable or detachable connections, for example, by soldering or welding, or also by screwing or clamping.

Additional cooling elements may advantageously be provided as components of the pre-assembled assembly, which after manufacture of the housing case extend in sections into the interior of the housing, where they form cooling elements for electric or electronic components. In addition, the cooling elements may also be used as fastening means, for example as screw-on surfaces, for components of the electric or electronic device situated in the interior of the housing.

All-around shielding may be easily achieved by closing off the cup-shaped housing with a plastic cover that has a molded-in shielding surface. This cover may be formed very easily and cost-effectively using a metal foil.

BRIEF DESCRIPTION OF THE DRAWINGS

The present invention is explained in greater detail below with reference to the appended drawing, which shows the following:

FIG. 1 illustrates a schematic cross-sectional view of a housing, designed according to embodiments of the present invention, for an electric or electronic device.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Referring now to FIG. 1, a schematic cross-sectional view of a housing in accordance with embodiments of the present invention is shown. The housing is for housing therein an electric or electronic device (not shown). The housing includes a cup-shaped, housing case (i.e., shell) 11. Housing case 11 is made of plastic. The housing further includes a pre-assembled assembly 20. Housing case 11 encloses pre-assembled assembly 20.

Pre-assembled assembly 20 is made of various metallic components 12, 13, and 14. The metallic components of pre-assembled assembly 20 include a metallic shielding body 12. Shielding body 12 has a planar design. As such, the material volume of shielding body 12 is relatively small in relation to the extension of the surfaces of the shielding body. Shielding body 12 is preferably made of a thin metal sheet, a metal foil, or a wire mesh. The material of shielding body 12 is formed into a trough-shaped object whose shape corresponds essentially to that of cup-shaped, housing case 11 which encloses the shielding body.

The metallic components of pre-assembled assembly 20 further include at least one metallic cooling channel 13. Cooling channel 13 is connected to shielding body 12. Cooling channel 13 is formed by a metal tubing. Cooling channel 13 forms a shape within housing case 11 that has multiple bends and is meandering, for example.

Shielding body 12 and cooling channel 13 may be manufactured from steel alloys, or also particularly advantageously from materials having good thermal conductivity, such as copper or aluminum.

At least two end sections of cooling channel 13 are guided through an outer wall of housing case 11 as a feed line 16 and a discharge line 17, respectively. It is thus possible to provide continuous flow cooling of housing case 11 using a cooling fluid, composed of water or oil, for example, that is supplied from the external environment of the housing.

The mechanical connection of shielding body 12 and cooling channel 13, which is formed by wound piping, mutually stabilizes these components to form pre-assembled assembly 20. The mechanical connection between shielding body 12 and cooling channel 13 may be established either as a nondetachable connection by soldering or welding, or by detachable connection means, such as screw-on pipe clamps. The connection means are preferably selected in such a way that, in addition to a stable mechanical connection, they also ensure good thermal coupling of the connected components 12 and 13.

Pre-assembled assembly 20 may further include metallic cooling elements 14. Cooling elements 14, after manufacture of housing case 11, extend into an interior 15 of housing case 11. As such, the electric and/or electronic components situated in the interior of housing case 11 (not shown) to be cooled may be mechanically and thermally connected to cooling elements 14. Thus, cooling elements 14 are concurrently advantageously used as heat dissipators as well as fastening elements.

Since cooling elements 14 are thermally coupled to shielding body 12 and/or to cooling channel 13, the heat generated by cooling the electric and/or electronic components is released via the components 12, 13, and 14 of pre-assembled assembly 20, and ultimately to the cooling fluid flowing through cooling channel 13.

After pre-assembled assembly 20 is completed, the pre-assembled assembly is extrusion-coated or wound with a plastic material, for which purpose the pre-assembled assembly is temporarily inserted into a hollow mold. As shown in FIG. 1, cooling channel 13, except for end sections that form feed and discharge lines 16 and 17, is completely enclosed by the plastic material.

A low-viscosity compound that cures by an exothermic reaction is preferably provided as plastic material. Suitable materials for this purpose are in particular those in the substance groups of polyurethane, polyurea, and other thermosetting materials.

Shielding body 12 enclosed in housing case 11 is designed in such a way that its surfaces traverse all four walls and the base floor of housing case 11. The components of the electric or electronic device situated within interior 15 of cup-shaped, housing case 11 are thus enclosed by five sides of metallic surfaces of shielding body 12 which are encapsulated in plastic.

The housing may further include a housing cover 31. Housing cover 31 is for closing off interior 15 of housing case 11. Housing cover 31 advantageously has a shielding surface 32. Shielding surface 32 may preferably be formed by a metal foil encapsulated in plastic. By attaching housing cover 31 to housing case 11, shielding body 12, which is open on one side, is additionally formed into a closed shielding shell whose function is similar to a Faraday cage.

It is advantageous to also connect shielding surface 32 electrically to shielding body 12, using metallic connecting elements. For this purpose, for example metal screws 34 may be inserted into screw openings 33 in housing cover 31 and connected to metallic screw-on elements 18 in housing case 11 that are electrically connected to shielding body 12. Since metal screws 34 also electrically contact shielding surface 32, they also establish the electrical connection between shielding surface 32 and shielding body 12.

Good shielding of interior 15 of housing case 11 with regard to undesirable irradiation and emission of electromagnetic radiation is thus achieved.

As illustrated in FIG. 1, it is advantageous for housing cover 31 to not only cover but also slightly overlap housing case 11, and likewise, for shielding surface 32 to not only cover but also slightly overlap shielding body 12.

The housing thus formed achieves a good cooling and electromagnetic shielding effect at comparatively low cost, which otherwise is realizable only with significantly more expensive metal housings. In addition, an advantageous weight reduction is achieved by using materials having a lower density than aluminum, for example.

| List of reference numerals | |
|---|---|
| 11 | housing case |
| 12 | shielding body |
| 13 | cooling channel |
| 14 | cooling elements |
| 12, 13, 14 | metallic components |
| 15 | interior |
| 16 | feed line |
| 17 | discharge line |
| 18 | screw-on elements |
| 19 | interior |
| 20 | (pre-assembled) assembly |
| 31 | housing cover |
| 32 | shielding surface |
| 33 | screw openings |
| 34 | metal screws |

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A housing for an electric or electronic device, comprising:
    a cup-shaped, plastic housing case;
    a cooling channel guided in the housing case for fluid cooling of an electric or electronic device situated in an interior of the housing case;
    a planar shielding body integrated into the housing case and traversing walls of the housing case for shielding from electromagnetic radiation; and
    wherein the shielding body is a metallic wire cage or trough, the cooling channel is a metallic tubing, the shielding body and the cooling channel are connected to form a frame-like, pre-assembled assembly, and the pre-assembled assembly, consisting of the shielding body and the cooling channel, is extrusion-coated with a plastic or encapsulated in a plastic to form the housing case.

2. The housing of claim 1 further comprising:
    metallic cooling elements connected to the shielding body and/or the cooling channel to further form the pre-assembled assembly, the cooling elements extending at least to surfaces of the interior of the housing case.

3. The housing of claim 2 wherein:
    the cooling elements form fastening elements for components of the electric or electronic device situated in the interior of the housing case.

4. The housing of claim 1 further comprising:
    a housing cover having a metallic shielding surface therein; and
    the housing cover is connectable to the housing case to close off the interior of the housing case.

5. The housing of claim 4 wherein:
    the shielding body integrated in the housing case and the shielding surface in the housing cover are electrically connected to one another when the housing cover is connected to the housing case.

6. The housing of claim 1 wherein:
    the cooling channel has a feed line and a discharge line that are led out from the housing case.

7. The housing of claim 1 wherein:
    the cooling channel has a shape having multiple bends within the housing case.

8. The housing of claim 1 wherein:
    for manufacturing the housing case, the pre-assembled assembly is wound with a low-viscosity compound which cures with release of heat.

9. The housing of claim 8 wherein:
    after curing, the low-viscosity compound forms a body made of a thermosetting material.

10. The housing of claim 9 wherein:
    the thermosetting material is a polyurethane or a polyurea.

11. The housing of claim 8 wherein:
    the low-viscosity compound includes thermal conductive fillers.

* * * * *